United States Patent [19]

Horowitz

[11] B 4,001,146

[45] Jan. 4, 1977

[54] NOVEL SILVER COMPOSITIONS

[75] Inventor: Samuel Jacob Horowitz, Snyder, N.Y.

[73] Assignee: E. I. Du Pont de Nemours and Company, Wilmington, Del.

[22] Filed: Feb. 26, 1975

[21] Appl. No.: 553,421

[44] Published under the second Trial Voluntary Protest Program on March 23, 1976 as document No. B 553,421.

[52] U.S. Cl. .............................. 252/514; 252/518; 106/1; 428/434
[51] Int. Cl.$^2$ .......................................... H01B 1/02
[58] Field of Search ............... 252/514, 518; 106/1; 428/434

[56] References Cited

UNITED STATES PATENTS

| | | | |
|---|---|---|---|
| 2,819,170 | 1/1958 | Short | 106/48 |
| 3,293,501 | 12/1966 | Martin | 317/101 |
| 3,763,409 | 10/1973 | Sheard | 317/258 |
| 3,776,769 | 12/1973 | Buck et al. | 106/1 |
| 3,799,890 | 3/1974 | Smith | 252/514 |
| 3,799,891 | 3/1974 | Smith | 252/514 |

FOREIGN PATENTS OR APPLICATIONS 855,625  12/1960  United Kingdom

OTHER PUBLICATIONS

*American Ceramic Society Bulletin* 46, 789 (1967), "An Air Fired Gold–Copper Oxide Paste".

*Primary Examiner*—Leland A. Sebastian
*Assistant Examiner*—E. Suzanne Parr

[57] ABSTRACT

Compositions useful for making electrical conductor patterns on a nonconductive substrate, the compositions comprising metal powder and 1–5% glass-free inorganic binder. The binder consists essentially of certain amounts of bismuth oxide and oxides of copper and/or lead, and optionally $MnB_2$ and/or $MnO_2$. The metal powder is either silver or a mixture of silver with a second metal powder; the second metal powder is Pt, Pd, Au, or an alloy of Cu with one or more of Pt, Pd, Au, and Ag. The weight ratio of Ag to other metals is at least 17/1. These compositions are useful for making conductor patterns on substrates, which patterns have good adhesion to the substrate, both initially and after thermal aging (e.g., 150° C. for 48 hours).

18 Claims, No Drawings

NOVEL SILVER COMPOSITIONS

BACKGROUND OF THE INVENTION

This invention relates to electronics, and more particularly to compositions useful for producing conductor patterns adherent to substrates.

Conductor compositions which are applied to and fired on dielectric substrates (glass, glass-ceramic, and ceramic) usually comprise finely divided inorganic powders (e.g., metal particles and binder particles) and are commonly applied to substrates using so-called "thick film" techniques, as a dispersion of these inorganic powders in an inert liquid medium or vehicle. Upon firing or sintering of the film, the metallic component of the composition provides the functional (conductive) utility, while the inorganic binder (e.g., glass, crystalline oxides such as $Bi_2O_3$, etc.) bonds the metal particles to one another and to the substrate. Thick film techniques are contrasted with thin film techniques which involve deposition of particles by evaporation or sputtering. Thick film techniques are discussed in *Handbook of Materials and Processes for Electronics*, C. A. Harper, Editor, McGraw-Hill, N.Y., 1970, Chapter 12.

The most commonly used conductor compositions employ noble metals, especially gold, silver, platinum, palladium, and their mixtures, alloys, and compounds, since their relatively inert characteristics permit firing in air. Attempts at using dispersions of less expensive non-noble metals have often been confined to specialized uses or have required the great practical inconvenience and expense of firing in non-oxidating atmospheres (nitrogen, nitrogen/hydrogen, hydrogen, argon, etc.).

The prior art on conductor compositions includes the use of glass binders for noble metals, as well as the use of glass-free binders, such as the copper oxide binder (with gold) mentioned by Gucker and Treptow (*Am. Ceram. Sc. Bull.* 46, 789, 1967), and by Smith in U.S. Pat. No. 3,799,890. Glass-free copper oxide/cadmium oxide binder was used with gold in Smith U.S. Pat. No. 3,799,891. Sheard U.S. Pat. No. 3,763,409 discloses glass-free compositions of palladium or palladium oxide plus copper oxide. Compositions of silver/copper oxide and silver/copper oxide/glass have been available commercially for about 15 years.

Martin U.S. Pat. No. 3,293,501 discloses conductive films of glasses comprising copper and bismuth oxides. Buck U.S. Pat. No. 3,776,769 discloses compositions of noble metal, copper oxide and glass, fireable in reducing atmospheres. White U.K. Pat. No. 855,625 discloses conductive films of silver, copper oxide, and an "inert" material such as alumina, magnesia, zirconia, titania, chromic oxide or aluminasilicate. Short U.S. Pat. No. 2,819,170 discloses compositions of silver and a vitrifiable flux of bismuth oxide and cadmium borate.

The more expensive noble metals (Au, Pt, Pd) provide more stable fired conductors. Despite its instability relative to the other noble metals, silver has been used either alone or with Pt or Pd to produce less expensive conductors. To increase adhesion to the substrate of such silver conductor compositions, the relative amount of inorganic binder is increased. However, often the more binder present, the lower the conductivity. There is a need for inexpensive silver-based compositions which can be fired as low as 850°C. in air to produce conductors exhibiting good aged adhesion to the substrate after soldering, both after being aged at room temperature or 150°C. for a day or two, and also have good soldering characteristics. Of special interest are conductor compositions of at least 95% metal (5% or less binder), which despite low binder levels exhibit relatively less sensitivity to variations in firing temperature, greater processing latitude. Also, firing capability at 850°C. is especially desirable; prior art compositions are often fired as high as 950°C.

SUMMARY OF THE INVENTION

Silver compositions are provided which employ only small amounts of a specified binder (1-5%) and hence do not substantially reduce conductivity of fired patterns made therewith. Despite the small amount of binder, low firing temperatures can be employed (e.g., 875°C. or below, preferably at about 850°C.). Furthermore, the binder is such that the compositions are of reduced sensitivity to firing temperature variations. The present binders can produce fired and soldered conductors or excellent adhesion (e.g., 4 lb. or 1.8 Kg. force), both initially (e.g., after storage at room temperature for 48 hr.), and after thermal aging (commonly 48 hr. at 150°C.).

The silver compositions of this invention are useful for forming highly adherent conductor patterns on ceramic dielectric substrates. The compositions comprise a glass-free mixture of finely divided inorganic powders dispersed in a liquid vehicle, the inorganic powders comprising, based upon the total weight of inorganic powders in the composition, 1-5% of a crystalline inorganic binder, and 95-99% metal powder. The metal powder is selected from among (i) silver and (ii) Ag plus Pt, Pd, Au, an alloy of Cu with one or more of Pt, Pd, Au, and Ag, or mixtures thereof. The ratio of silver (in whatever form) to these other elements is at least 17/1 by weight, preferably at least 19/1.

The organic binder may consist essentially of 0.3-6 parts by weight of copper oxide and/or lead oxide per part by weight of bismuth oxide. Alternately the binder may be 1-6 parts by weight copper oxide and/or lead oxide, 0.5-4 parts by weight bismuth oxide, and 0.5-2 parts by weight of $MnB_2$ and/or $MnO_2$.

Preferred compositions comprise about 1 part copper oxide and/or lead oxide and 1 part bismuth oxide. Other preferred compositions comprise 1 part copper oxide, 1 part bismuth oxide, and 1 part lead oxide. Still other preferred compositions comprise about 6 parts copper oxide, 1 part bismuth oxide, and 1 part $MnB_2$, $MnO_2$, or mixtures thereof.

In more preferred compositions there is 1.5-4% inorganic binder in total inorganics present.

Also of this invention are ceramic dielectric substrates having adherent thereto the sintered (fired) compositions described above.

DETAILED DESCRIPTION OF THE INVENTION

The compositions of the present invention comprise finely divided inorganic particles dispersed in an inert liquid medium or vehicle. The term "finely divided" will be understood by those skilled in the thick film art to mean particles sufficiently fine to pass through a 400-mesh screen (U.S. standard sieve scale). It is preferred that substantially all the particles have a largest dimension in the range 0.001–15 microns, the largest dimension more preferably being no larger than 5 microns.

Preferred silver particles include the commercially available "polished" silver flake particles and precipitated powder, each having a largest dimension in the range 0.1–15 microns.

In addition to silver particles, additive metal particles may optionally be present to enhance solder leach resistance of the resultant fired conductor, and to reduce cost in the case of copper alloys. It is thought that the more Pt present, the less sintering will occur at a given firing temperature, due to the higher melting point of Pt. Low temperature firing capability is desired in the silver compositions. The ratio of Ag to other metals (at least 17/1, by weight, preferably at least 19/1, by weight) permits good adhesion at low firing temperatures using the present binders.

While the preferred additive metal is Pt, one or more of the other metal powders mentioned above may be used. The copper alloy powders with Pt, Pd, Au, and/or Ag may be purchased commercially. Spray manufacturing techniques may be used to make such alloys (e.g., the Ag/Cu alloy of Example 24). Coprecipitated alloy powder (Pd/Cu) was used in Example 22. Such coprecipitated alloys, as in known in the art, may be formed by reductive precipitation from solutions containing salts of two or more metals. The proportions of the metals in the solution are those desired in the coprecipitate powder. The reductants include any of those which are capable of simultaneously coprecipitating the desired metals from solution, e.g., for Pd/Cu alloys such reductants include hydrazine sulfate, sodium borohydride, amine boranes, etc. Coprecipitation techniques are, for example, described in Hoffman U.S. Pat. No. 3,390,981 and Short U.S. Pat. No. 3,620,714.

The inorganic binder is of the essence of the present invention. At least about 1% by weight binder (based on total inorganics) is present to produce an acceptable level of adhesion. No more than about 5% binder is present for good conductivity, since as little as 1–5% will produce acceptable adhesion.

The inorganic binder of this invention is a (glass-free) crystalline binder based upon copper oxide ($Cu_2O$ and/or $CuO$) and/or lead oxide ($PbO$) plus bismuth oxide ($Bi_2O_3$). Optional in the binder are $MnB_2$, $MnO_2$, and mixtures thereof. Precursors of these materials (such as cupric carbonate) may be used. In the inorganic binder there may be 0.3 to 6 parts by weight copper oxide and/or lead oxide per part $Bi_2O_3$, preferably 0.5–2 parts by weight copper oxide and/or lead oxide per part $Bi_2O_3$. Where one or more of the optional additives $MnB_2$ and $MnO_2$ are also present, there are 1–6 parts copper oxide and/or lead oxide, 0.5–4 parts bismuth oxide, and 0.5–2 parts additive present.

The inorganic particles are mixed with an inert liquid vehicle by mechanical mixing (e.g., on a roll mill) to form a paste-like composition. The latter is printed as thick film on conventional dielectric substrates in the conventional manner. Any inert liquid may be used as the vehicle. Water or any one of various organic liquids, with or without thickening and/or stabilizing agents and/or other common additives, may be used as the vehicle. Exemplary of the organic liquids which can be used are the aliphatic alcohols; esters of such alcohols, for example, the acetates and propionates; terpenes such as pine oil, terpineol and the like; solutions of resins such as the polymethacrylates of lower alcohols, or solutions of ethyl cellulose, in solvents such as pine oil and the monobutyl ether of ethylene glycol monoacetate. The vehicle may contain or be composed of volatile liquids to promote fast setting after application to the substrate.

The ratio of vehicle to solids in the dispersions may vary considerably and depends upon the manner in which the dispersion is to be applied and the kind of vehicle used. Normally to achieve good coverage the dispersions will contain, complementally, 60–90% solids and 10–40% vehicle. The compositions of the present invention may, of course, be modified by the addition of other materials which do not affect its beneficial characteristics.

After drying to remove the vehicle, firing of the compositions of the present invention is carried out at temperatures and for times sufficient to sinter the inorganic materials and to produce conductor patterns adherent to the dielectric substrate. The duration and peak temperature of firing are selected interdependently, longer duration permitting lower temperatures, so long as sintering occurs. Generally firing will be conducted in the range 800°–930°C., for 5–30 minutes at peak, preferably 830°–875°C., more preferably about 850°C., for 8–10 minutes at peak.

EXAMPLES

The following examples and comparative showings are presented to illustrate the invention, including the importance of the inorganic binder of this invention. In the examples and elsewhere in the specification and claims all parts, percentages, and ratios are by weight, unless otherwise stated.

All of the inorganic materials except Pt and Pd used in these experiments had an average particle size in the range 0.1–3 microns, with substantially no particles larger than 15 microns. The Pt had an average particle size in the range 0.001–0.01 micron. The Pd had an average particle size in the range 0.001–0.03 micron. The vehicle was 9 parts ethyl cellulose and 1 part $\beta$-terpineol or Eastman Kodak texanol (2,2,4-trimethylpentanediol-1,3-monoisobutyrate).

The glass binder used in comparative showing B, Table I, contained 58.8% $PbO$, 23.0% $SiO_2$, 7.8% $B_2O_3$, 6.1% $TiO_2$, 3.9% $CdO$, 0.4% $Al_2O_3$.

After the inorganic solids and vehicle had been thoroughly mixed by conventional roll milling techniques, the resultant dispersion was printed on a prefired alumina substrate through a patterned 200-mesh screen having nine 80-mil (2-mm) openings aligned in a 3 by 3 matrix. The print was dried at about 150°C. to form a dry print about 1.4 mil (0.036 mm) thick. The dried print was heated in a conventional belt furnace over a 45–60 min. heating cycle, with about 8–10 minutes at the peak temperature indicated in the tables. The fired print had a thickness of about 0.7 mil (0.018 mm).

Adhesion was tested as follows. Wire leads were attached to the fired conductor pads by placing a 20-gauge pretinned copper wire across three of the fired metallization pads and then dipping them in a solder pot (62/36/2, Sn/Pb/Ag) at 220°C. Bond strengths were then measured by pulling the soldered leads with an Instron tester. Several pads were pulled for each sample to obtain a representative bond strength. When "Kg" is referred to, "kilograms force" is intended.

Initial adhesion of the fired print was determined after the fired product had been allowed to stand at room temperature for 24–48 hr. "Aged" adhesion was determined after the fired product had been thermally aged at 150°C. for 48 hr. Example 6 differs in that initial adhesion was determined after 84 hours at room temperature and aged adhesion after 60 hours at 150°C. In Examples 13–15 and Showings D and E initial adhesion was determined after 24 hr., and aged adhesion after 24 hr. at 150°C. See below also.

Resistance to leaching by molten solder was determined on a number of examples and comparative showings by dipping fired parts into a molten solder bath (230°C.) of 62/36/2 Sn/Pb/Ag using a mildly active flux (Dutch Boy 115). Each cycle included dipping in flux, dipping in solder for 10 seconds, and washing off flux residue. The number of cycles withstood by various samples are indicated below. Solder acceptance was determined by a single dip in the same solder held at 220°C.

EXAMPLES 1–8; SHOWINGS A–D

Referring to Table I, Showing A illustrates that copper oxide alone, absent bismuth oxide, produces inadequate adhesion to the substrate. Showing B uses a glassy binder constant. In Showing C, a 15/1 ratio, Ag/Pt, produced inadequate aged adhesion.

Examples 4–8 illustrate the use of a binder of copper oxide/bismuth oxide/lead oxide, to be compared with Showing D wherein inadequate aged adhesion is obtained with a similar binder from which bismuth oxide has been omitted.

EXAMPLES 9 and 10

These examples illustrate the degree of latitude in firing temperature that can be used with the compositions of the present invention, despite the low percentage binder therein. Reduced sensitivity to variation in firing temperature is important, since in practice oven temperatures will vary.

The compositions of Examples 7 and 8 were used in Examples 9 and 10, respectively. A series of samples were fired at 830°C., and a second series were fired at 890°C., each for a firing cycle of 1 hour duration with about 10 minutes at peak. Initial and aged adhesion data are reported in Table II.

TABLE I

|  | Showing A | Showing B | Example 1 | Example 2 | Example 3 | Example 4 |
|---|---|---|---|---|---|---|
| Ag - wt. | 70 | 80 | 70 | 80 | 80 | 80 |
| Pt - wt. | — | — | — | — | — | — |
| Binder - wt. | 7.75 | 4.65 | 1.0 | 2.0 | 2.0 | 3.0 |
| - % inorg. | 10 | 5.5 (glass) | 1.4 | 2.4 | 2.4 | 3.6 |
| $Cu_2O$ - wt. | 7.75 | — | 0.75 | 1.0 | 1.71 | 1.0 |
| $Bi_2O_3$ - wt. | — | — | 0.25 | 1.0 | 0.29 | 1.0 |
| PbO - wt. | — | — | — | — | — | 1.0 |
| Vehicle - wt. | 22.25 | 15.35 | 29 | 18.0 | 18.0 | 17.0 |
| Ag/Pt wt. ratio | — | — | — | — | — | — |
| $Cu_2O/Bi_2O_3$ wt. ratio | — | — | 3/1 | 1/1 | 6/1 | 1/1 |
| $Cu_2O/Bi_2O_3$/PbO wt. ratio | — | — | — | — | — | 1/1/1 |
| Adhesion in lb. (Kg.), 850° fire |  |  |  |  |  |  |
| Initial | <1(<.5) | 7.6(3.5) | 6.2(2.8) | 6.4(2.9) | 6.4(2.9) | 6.1(2.8) |
| Aged | <1(<.5) | 2.5(1.1) | 4.6(2.1) | 5.7(2.6) | 5.4(2.5) | 5.9(2.7) |
| 900–910° fire |  |  |  |  |  |  |
| Initial | 3.0(1.4) | — | 6.8(3.1) | — | — | — |
| Aged | 1(0.5) | — | 6.4(2.9) | — | — | — |
| Solder Acceptance | good | poor | good | good | good | good |

|  | Example 5 | Example 6 | Showing C | Example 7 | Example 8 | Showing D |
|---|---|---|---|---|---|---|
| Ag - wt. | 77 | 76 | 75 | 80 | 80 | 70 |
| Pt - wt. | 3 | 4 | 5 | 1.0 | 1 | — |
| Binder - wt. | 3.0 | 3.0 | 3.0 | 3.0 | 2.25 | 1.0 |
| - % inorg. | 3.6 | 3.6 | 3.6 | 3.6 | 2.7 | 1.4 |
| $Cu_2O$ - wt. | 1.0 | 1.0 | 1.0 | 1.0 | 0.75 | 0.75 |
| $Bi_2O_3$ - wt. | 1.0 | 1.0 | 1.0 | 1.0 | 0.75 | — |
| PbO - wt. | 1.0 | 1.0 | 1.0 | 1.0 | 0.75 | 0.25 |
| Vehicle - wt. | 17.0 | 17.0 | 17.0 | 16 | 16.75 | 29 |
| Ag/Pt wt. ratio | 26/1 | 19/1 | 15/1 | 80/1 | 80/1 | — |
| $Cu_2O/Bi_2O_3$ wt. ratio | 1/1 | 1/1 | 1/1 | 1/1 | 1/1 | — |
| $Cu_2O/Bi_2O_3$/PbO wt. ratio | 1/1/1 | 1/1/1 | 1/1/1 | 1/1/1 | 1/1/1 | — |
| Adhesion in lb. (Kg.), 850° fire |  |  |  |  |  |  |
| Initial | 6.4(2.9) | 6.9(3.1) | 5.7(2.6) | 5.8(2.6) | 6.2(2.8) | 5.3(2.4) |
| Aged | 5.3(2.4) | 6.7(3.0) | 1.4(0.6) | 6.2(2.8) | 5.4(2.5) | <1(<.5) |
| 900–910° fire |  |  |  |  |  |  |
| Initial | — | — | — | — | — | 6.5(3.0) |
| Aged | — | — | — | — | — | 2.0(0.9) |
| Solder Acceptance | fair | good | fair | good | good | good | which produces inadequate aged adhesion after an 850°C. firing. Solder leach resistance with the fired product of Showing B was found to be less than 5 cycles (contrast the results with Examples 20–25). Examples 1 through 4 illustrate that excellent properties can be obtained in the absence of platinum additions with copper oxide/bismuth oxide binder and with copper oxide/bismuth oxide/lead oxide binder. Examples 1–3 illustrate variation in the copper oxide/bismuth oxide ratio. Consideration of Examples 4–6 and Showing C together illustrates the effect of varying the platinum content of the compositions while holding the binder

TABLE II

| Example No. | Adhesion in lb. (Kg.) | | | |
|---|---|---|---|---|
|  | Fired at 830°C. | | Fired at 890°C. | |
|  | Initial | Aged | Initial | Aged |
| 9 | 6.4(2.9) | 6.7(3.0) | 6.2(2.8) | 6.2(2.8) |
| 10 | 6.0(2.7) | 6.1(2.8) | 5.8(2.6) | 6.1(2.8) |

EXAMPLE 11

Example 7 had employed a composition of silver, platinum, $Cu_2O$, PbO, and $Bi_2O_3$. Example 11 was conducted using the same materials and proportions as were used in Example 7, except that CuO was substituted for $Cu_2O$. Similar results were obtained after firing at 850°C., i.e., initial adhesion of 5.7 lb. (2.6 Kg.) and aged adhesion of 6.4 lb. (2.9 Kg.), with good solder acceptance.

EXAMPLE 12

This example used a precursor of copper oxide, cupric carbonate basic powder, $CuCO_3 \cdot Cu(OH)_2$, and the procedure of Example 1, including firing at 850°C. A composition of 80 parts silver, 1.0 part platinum, 4.0 parts binder (1 part PbO, 1 part $Bi_2O_3$, and 2 parts of the copper salt), and 15 parts vehicle was fired to a peak temperature of 850°C. Initial adhesion was 6.2 lb. (2.8 Kg.), aged adhesion was 5.9 lb. (2.7 Kg.), with fair solder acceptance.

EXAMPLES 13–15; SHOWINGS E–F

Examples 13–15 show the use of copper oxide/bismuth oxide/manganese oxide binder, both with and without platinum additions. The results obtained in Examples 13–15 are to be contrasted with the results in Showing E wherein a similar binder is used, but an excess of platinum (10% platinum). The results in Examples 13–15 are further contrasted with those of Showing F wherein the binder lacks bismuth oxide. See Table III. Solder leach resistance for Example 14 was in excess of 10 cycles.

EXAMPLES 16–19; SHOWINGS G–H

Examples 16–19 (Table IV) illustrate that excellent adhesion can be obtained using a binder of copper oxide/bismuth oxide/manganese boride, either in the absence of platinum or with the addition of platinum at various levels. Showing G illustrates deterioration of aged adhesion using excess platinum (10% platinum), while Showing H illustrates the importance of using the binder of the present invention since aged adhesion deteriorates in the absence of bismuth oxide. Solder leach resistance for Example 18 was in excess of 10 cycles.

EXAMPLES 20–25

A series of examples were run wherein the binder was held constant ($Cu_2O/Bi_2O_3/PbO$, in equal proportions by weight), with silver powder alone (Example 25) or with silver powder plus powder of various additive metals (Pt, Pd, 1/1 Pd/Cu alloy, Au, and 19/1 Ag/Cu alloy in Examples 20–24, respectively). Excellent adhesion (initial and aged) was obtained. Resistance to solder leaching was excellent (withstood at least 18 cycles) in each example (see Table V), to be contrasted with the fired compositions of Showing B (Table I) which withstood less than 5 cycles. Solder acceptance was "good" in each of Examples 20–25.

In Example 25, the overall ratio of Ag/additive metal was obtained by adding the free silver powder and the silver in the alloy powder.

TABLE III

| | Example 13 | Example 14 | Example 15 | Showing E | Showing F |
|---|---|---|---|---|---|
| Ag - wt. | 80 | 78.4 | 76.8 | 72 | 70 |
| Pt - wt. | — | 2.0 | 4.0 | 10 | — |
| Binder - wt. | 2.0 | 2.0 | 1.9 | 1.8 | 1.0 |
| - % inorg. | 2.4 | 2.4 | 2.3 | 2.1 | 1.4 |
| $Cu_2O$ - wt. | 1.5 | 1.5 | 1.44 | 1.35 | 0.75 |
| $Bi_2O_3$ - wt. | 0.25 | 0.25 | 0.24 | 0.23 | — |
| $MnO_2$ - wt. | 0.25 | 0.25 | 0.24 | 0.23 | 0.25 |
| Vehicle - wt. | 18 | 17.6 | 17.3 | 16 | 29 |
| Ag/Pt wt. ratio | — | 40/1 | 19/1 | 7/1 | 70/1 |
| Copper Oxide/$Bi_2O_3$ wt. ratio | 6/1 | 6/1 | 6/1 | 6/1 | — |
| Copper Oxide/$Bi_2O_3$/$MnO_2$ wt. ratio | 6/1/1 | 6/1/1 | 6/1/1 | 6/1/1 | — |
| Adhesion in lb. (Kg.), 850° fire | | | | | |
| Initial | 7.7(3.5) | 7.8(3.5) | 7.2(3.3) | 5.9(2.7) | <1(<0.5) |
| Aged | 7.2(3.3) | 7.7(3.5) | 7.0(2.7) | 1.4(0.6) | <1(<0.5) |

TABLE IV

| | Example 16 | Example 17 | Example 18 | Example 19 | Showing G | Showing H |
|---|---|---|---|---|---|---|
| Ag - wt. | 80 | 80 | 78.4 | 76.8 | 72 | 70 |
| Pt - wt. | — | 1 | 2.0 | 4 | 10 | — |
| Binder - wt. | 2.0 | 3 | 2.0 | 1.9 | 1.81 | 1 |
| - % inorg. | 2.4 | 3.6 | 2.4 | 2.3 | 2.1 | 1.4 |
| $Cu_2O$ - wt. | 1.5 | 1 | 1.5 | 1.44 | 1.35 | 0.75 |
| $Bi_2O_3$ - wt. | 0.25 | 1 | 0.25 | 0.24 | 0.23 | — |
| $MnB_2$ - wt. | 0.25 | 1 | 0.25 | 0.24 | 0.23 | 0.25 |
| Vehicle - wt. | 18 | 16 | 17.6 | 17.3 | 16.2 | 29 |
| Ag/Pt wt. ratio | — | 80/1 | 40/1 | 20/1 | 7/1 | — |
| Copper Oxide/$Bi_2O_3$ wt. ratio | 6/1 | 1/1 | 6/1 | 6/1 | 6/1 | — |
| Copper Oxide/$Bi_2O_3$/$MnB_2$ wt. ratio | 6/1/1 | 1/1/1 | 6/1/1 | 6/1/1 | 6/1/1 | — |
| Adhesion in lb. (Kg.), 850° fire | | | | | | |
| Initial | 6.9(3.1) | 6.0(2.7) | 8.0(3.6) | 6.9(3.1) | 7.1(3.2) | 5.1(2.3) |
| Aged | 7.1(3.2) | 6.1(2.8) | 7.2(3.3) | 7.0(3.1) | 1.9(0.9) | <1(<0.5) |

TABLE V

| | Example 20 | Example 21 | Example 22 | Example 23 | Example 24 |
|---|---|---|---|---|---|
| Ag - wt. | 80 | 80 | 80 | 80 | 70 |
| Additive metal | Pt | Pd | Pd/cu(1/1) | Au | Ag/Cu(19/1) |
| - wt. | 1 | 1 | 1 | 1 | 10 |
| Binder - wt. | 3 | 3 | 3 | 3 | 3 |

TABLE V-continued

|  | Example 20 | Example 21 | Example 22 | Example 23 | Example 24 |
|---|---|---|---|---|---|
| Vehicle - wt. | 16 | 16 | 16 | 16 | 17 |
| Ag/Additive metal, wt. ratio | 80/1 | 80/1 | 80/1 | 80/1 | 79.5/0.5 |
| Adhesion in lb. (Kg.) 850° fire |  |  |  |  |  |
| Initial | 7.2(3.3) | 7.3(3.3) | 7.3(3.3) | 7.2(3.3) | 6.9(3.1) |
| Aged | 6.5(3.0) | 5.6(2.5) | 6.6(3.0) | 5.1(2.3) | 5.0(2.3) |
| Solder Leach Resistance - cycles | >20 | 20 | >20 | 20 | >20 |

|  | Example 25 | Example 26 | Showing I | Showing J |
|---|---|---|---|---|
| Ag - wt. | 80 | 77 | 75 | 72 |
| Additive metal |  | Pd | Pd | Pd |
| - wt. | — | 3 | 5 | 8 |
| Binder - wt. | 3 | 3 | 3 | 3 |
| Vehicle - wt. | 17 | 17 | 17 | 17 |
| Ag/Additive metal, wt. ratio | — | 26/1 | 15/1 | 9/1 |
| Adhesion in lb. (Kg.) 850°C. fire |  |  |  |  |
| Initial | 7.2(3.3) | 6.4(2.9) | 7.0(3.2) | 7.6(3.5) |
| Aged | 5.7(2.6) | 5.9(2.7) | <1.0(<0.5) | <1.0(<0.5) |
| Solder Leach Resistance - cycles | 18 | 7 | 7 | <6 |

EXAMPLE 26; SHOWINGS I AND J

Another series of experiments were run wherein the amount of Pd additive was varied, but the inorganic binder was held constant (see Table V). An Ag/Pd ratio of 26/1 produced good results, but ratios of 15/1 and 9/1 did not. Initial and aged adhesion were each determined after 46 hr.

EXAMPLES 27 AND 28

These examples illustrate the use of a small amount of copper oxide, much less than 1/1 copper oxide/bismuth oxide, on a weight basis (see Table VI).

SHOWINGS K AND L

These illustrate (Table VI) the use of a binder not of this invention, one of bismuth oxide, and $MnO_2$ or $MnB_2$, but no copper or lead oxide. Initial adhesion was determined after 100 hr. and aged adhesion after 48 hr.

EXAMPLE 29

This example illustrates a bismuth oxide/lead oxide binder (no copper oxide present). The procedure of Example 1 was repeated with a composition of 80 parts silver, 1 part platinum, 1 part $Bi_2O_3$, and 1 part PbO, dispersed in 17 parts vehicle. After firing at a peak temperature of 850°C., initial adhesion after 84 hours at room temperature was 7.3 lb. (3.3 Kg.). Aged adhesion after 60 hours at 150°C. was 6.7 lb. (3.0 Kg.). Solder acceptance was good.

I claim:
1. Silver compositions useful for forming highly adherent conductor patterns on ceramic dielectric substrates, said compositions comprising a glass-free mixture of finely divided inorganic powders dispersed in a liquid vehicle, the inorganic powders comprising, based upon the total weight of inorganic powders in the composition, 1–5% crystalline inorganic binder and 95–99% metal powder selected from among (i) Ag and (ii) Ag plus Pt, Pd, Au, an alloy of Cu with one or more of Pt, Pd, Au, and Ag, or mixtures thereof; wherein the weight ratio of Ag to other metals is at least 17/1; and wherein said crystalline inorganic binder consists essentially of bismuth oxide plus copper oxide, or lead oxide, or mixtures thereof, there being 0.3–6 parts by weight of copper oxide and/or lead oxide per part by weight of bismuth oxide.
2. A composition according to claim 1 wherein the metal powder is selected from among (i) silver or (ii) a mixture of silver and platinum powders.
3. Silver compositions useful for forming highly adherent conductor patterns on ceramic dielectric substrates, said compositions comprising a glass-free mixture of finely divided inorganic powders dispersed in a liquid vehicle, the inorganic powders comprising, based upon the total weight of inorganic powders in the composition, 1–5% crystalline inorganic binder and 95–99% metal powder selected from among (i) Ag and (ii) Ag plus Pt, Pd, Au, or an alloy of Cu with one or more of Pt, Pd, Au, and Ag, or mixtures thereof;

TABLE VI

|  | Example 27 | Example 28 | Showing K | Showing L |
|---|---|---|---|---|
| Ag - wt. | 80 | 80 | 80 | 80 |
| Pt - wt. | 1 | 1 | 1 | 1 |
| Binder - wt. | 2.5 | 2.0 | 1.5 | 1.5 |
| - $Cu_2O$ | 0.5 | 0.5 | — | — |
| - $Bi_2O_3$ | 1.0 | 1.5 | 1 | 1 |
| -PbO | 1.0 | — | — | — |
| $MnO_2$ | — | — | — | 0.5 |
| -$MnB_2$ | — | — | 0.5 | — |
| Vehicle - wt. | 16.5 | 17 | 17.5 | 17.5 |
| Ag/Pt wt. ratio | 80/1 | 80/1 | 80/1 | 80/1 |
| $Cu_2O/Bi_2O_3$ wt. ratio | 0.5/1 | 0.33/1 | — | — |
| Adhesion in lb. (Kg.), 850°C. fire |  |  |  |  |
| - Initial | 7.4(3.4) | 7.3(3.3) | 6.3(2.9) | 7.4(3.4) |
| - Aged | 6.7(3.0) | 6.7(3.0) | 3.8(1.7) | <2(<0.9) |
| Solder Leach Resistance - Cycles | 20 | 20 | 7 | 7 | wherein the weight ratio of Ag to other metals is at least 17/1; and wherein said crystalline inorganic binder consists essentially of (A) bismuth oxide, (B) lead oxide, copper oxide, or mixtures thereof and (C) $MnB_2$, $MnO_2$, or mixtures thereof, there being in said binder 0.5–4 parts by weight bismuth oxide, 1–6 parts by weight lead oxide, copper oxide, or mixtures thereof, and 0.5–2 parts by weight of $MnB_2$, $MnO_2$, or mixtures thereof.

4. A composition according to claim 3 wherein the metal powder is selected from among (i) silver or (ii) a mixture of silver and platinum powders.

5. Compositions according to claim 1 comprising about 1 part bismuth oxide per part of copper oxide, lead oxide, or mixtures thereof.

6. Compositions according to claim 1 wherein the ratio of Ag to other metals is at least 19/1 by weight.

7. Compositions according to claim 2 wherein the ratio of Ag to other metals is at least 19/1 by weight.

8. Compositions according to claim 1 comprising 1.5–4% binder.

9. Compositions according to claim 1 comprising about 1 part copper oxide, 1 part bismuuth oxide, and 1 part lead oxide.

10. Compositions according to claim 3 comprising about 6 parts copper oxide, 1 part bismuth oxide, and 1 part $MnB_2$, $MnO_2$, or mixtures thereof.

11. Compositions according to claim 3 wherein the ratio of Ag to other metals is at least 19/1 by weight.

12. Compositions according to claim 3 comprising 1.5–4% binder.

13. A dielectric substrate having adherent thereto the composition of claim 1.

14. A dielectric substrate having adherent thereto the composition of claim 2.

15. A dielectric substrate having adherent thereto the composition of claim 3.

16. A dielectric substrate having adherent thereto the composition of claim 4.

17. A dielectric substrate having adherent thereto the composition of claim 6.

18. A dielectric substrate having adherent thereto the composition of claim 11.

* * * * *